（12）United States Patent
Joerg et al.

(10) Patent No.: US 10,741,946 B2
(45) Date of Patent: Aug. 11, 2020

(54) CONNECTION OF AN ELECTRICAL CONDUCTING ELEMENT TO A PRINTED CIRCUIT BOARD OF A LIGHT FIXTURE

(71) Applicant: LEDVANCE GmbH, Garching bei München (DE)

(72) Inventors: Anton Joerg, Eitensheim (DE); Matthias Kellner, Eichstät (DE); Thomas Klafta, Maxhüte-Haidhof (DE); Wolfgang Seitz, Eichstät (DE); Christoph Steidl, Eichstät (DE); Marcel Vuc, Ingolstadt (DE)

(73) Assignee: LEDVANCE GMBH, Garching bei München (DE)

( * ) Notice: Subject to any disclaimer, the term of this patent is extended or adjusted under 35 U.S.C. 154(b) by 0 days.

(21) Appl. No.: 16/032,481

(22) Filed: Jul. 11, 2018

(65) Prior Publication Data

US 2019/0036249 A1 Jan. 31, 2019

(30) Foreign Application Priority Data

Jul. 26, 2017 (DE) .................. 10 2017 116 936

(51) Int. Cl.
*H01R 12/70* (2011.01)
*H01R 4/02* (2006.01)
(Continued)

(52) U.S. Cl.
CPC ......... *H01R 12/7088* (2013.01); *H01R 4/027* (2013.01); *H01R 12/53* (2013.01);
(Continued)

(58) Field of Classification Search
CPC ...... H01R 43/16; H01R 12/58; H01R 12/585; H01R 13/187; H01R 12/718;
(Continued)

(56) References Cited

U.S. PATENT DOCUMENTS 3,784,965 A * 1/1974 Murphy ............... H01R 12/718
439/844
4,050,772 A * 9/1977 Birnholz ............. H01R 12/718
439/444
(Continued)

FOREIGN PATENT DOCUMENTS

| AT | 260328 B | 2/1968 |
| DE | 2820665 A1 | 5/1979 |
| DE | 4218630 A1 | 12/1992 |

*Primary Examiner* — Edwin A. Leon
*Assistant Examiner* — Matthew T Dzierzynski
(74) *Attorney, Agent, or Firm* — Hayes Soloway PC

(57) ABSTRACT

A tube used for producing an electrically conductive connection between an electrical conducting element and a printed circuit board of a light fixture. The use of the tube in the printed circuit board makes it possible, due to a corresponding configuration and a region which widens in relation to the longitudinal direction, that the tube can be connected to the printed circuit board or is held thereby and can be soldered. Additionally, the configuration or widened portion prevents soldering agent from penetrating into the tube, so that a wire for voltage supply can then be introduced into the tube and can be connected thereto by deformation. As a result, an automatic and reliable method is made possible, so that a cost saving is produced.

20 Claims, 2 Drawing Sheets

(51) Int. Cl.
  *H01R 43/02* (2006.01)
  *H01R 12/58* (2011.01)
  *H01R 12/53* (2011.01)
  *H05K 3/34* (2006.01)
  *H01R 12/71* (2011.01)
  *H05K 1/18* (2006.01)

(52) U.S. Cl.
  CPC ......... *H01R 12/58* (2013.01); *H01R 12/7076* (2013.01); *H01R 12/712* (2013.01); *H01R 43/0256* (2013.01); *H05K 1/18* (2013.01); *H05K 3/3447* (2013.01); *H05K 2201/10287* (2013.01); *H05K 2201/10333* (2013.01)

(58) Field of Classification Search
  CPC .. H01R 13/111; H01R 12/57; H01R 12/7082; H01R 12/714; H01R 12/73; H01R 12/737; H01R 13/03; H01R 13/052; H01R 13/11; H01R 13/2407; H01R 13/2442; H05K 1/0206; H05K 1/115; H05K 1/184; H05K 2201/0116; H05K 2201/0133; H05K 2201/0145; H05K 2201/015; H05K 2201/0162; H05K 2201/068; H05K 2201/09845; H05K 2201/10189; H05K 2201/10265; H05K 2201/1059; F21Y 2115/10; F21Y 2101/00; F21Y 2103/10; F21Y 2107/00; H01J 5/62; H01J 5/50; H01J 5/54; H01J 61/34; H01J 61/56; F21V 29/773; F21V 15/01; F21V 17/12; F21V 19/002; F21V 23/006; F21V 23/06; F21V 29/713; F21V 29/85; F21V 5/007; F21V 5/04; F21V 17/005; F21V 17/101
  See application file for complete search history.

(56) References Cited

U.S. PATENT DOCUMENTS

| | | | | |
|---|---|---|---|---|
| 4,097,101 A * | 6/1978 | Holt | | H01R 12/58 439/816 |
| 4,186,990 A * | 2/1980 | Bertoglio | | H01R 13/187 439/843 |
| 4,526,429 A * | 7/1985 | Kirkman | | H01R 12/58 439/751 |
| 4,822,288 A * | 4/1989 | Conley | | H01R 12/58 439/221 |
| 4,878,854 A * | 11/1989 | Cannon | | F21V 19/0085 439/236 |
| 5,135,403 A * | 8/1992 | Rinaldi | | H01R 12/585 439/82 |
| 5,147,227 A * | 9/1992 | Yurko | | H01R 13/41 439/733.1 |
| 5,154,621 A * | 10/1992 | Legrady | | H01R 12/58 439/75 |
| 5,362,244 A * | 11/1994 | Hanson | | H01R 12/58 439/82 |
| 5,509,814 A * | 4/1996 | Mosquera | | H01R 12/58 439/78 |
| 6,992,496 B2 * | 1/2006 | Winter | | G01R 1/0441 324/750.25 |
| 7,069,647 B2 * | 7/2006 | Hogerl | | H01L 21/67144 198/345.3 |
| 7,277,297 B2 * | 10/2007 | Ahmad | | H01R 13/187 361/760 |
| 7,329,159 B2 * | 2/2008 | Wilson | | H01R 33/0827 439/884 |
| 7,339,157 B2 * | 3/2008 | Faller | | F21K 9/00 250/227.11 |
| 7,347,698 B2 * | 3/2008 | Dittmann | | B23P 15/00 439/45 |
| 7,425,139 B2 | 9/2008 | Hsu et al. | | |
| 7,527,533 B2 * | 5/2009 | Lappoehn | | H01R 12/585 439/751 |
| 7,855,092 B2 * | 12/2010 | Shimizu | | C09K 11/7767 257/E33.044 |
| 7,943,941 B2 * | 5/2011 | Shimizu | | C09K 11/7767 257/103 |
| 8,066,541 B2 * | 11/2011 | Schuck | | H01J 5/50 313/318.01 |
| 8,137,144 B1 * | 3/2012 | Wang | | H01R 13/187 439/78 |
| 8,523,411 B2 * | 9/2013 | Kawagoe | | F21V 5/007 362/373 |
| 8,932,090 B2 * | 1/2015 | Jaeckle | | H01R 4/26 439/866 |
| 9,325,095 B2 * | 4/2016 | Glick | | H01R 13/187 |
| 9,696,023 B2 * | 7/2017 | Wang | | F21V 23/00 |
| 2006/0227558 A1 * | 10/2006 | Osawa | | F21V 3/00 362/351 |
| 2012/0187836 A1 * | 7/2012 | Hashimoto | | F21V 5/04 315/51 |
| 2012/0268941 A1 * | 10/2012 | Shih | | F21V 3/02 362/294 |
| 2015/0055354 A1 * | 2/2015 | Mueller | | F21K 9/23 362/373 |
| 2017/0297130 A1 * | 10/2017 | Jenrich | | B23K 1/0016 |

\* cited by examiner

CONNECTION OF AN ELECTRICAL CONDUCTING ELEMENT TO A PRINTED CIRCUIT BOARD OF A LIGHT FIXTURE

CROSS-REFERENCE TO RELATED APPLICATIONS AND PRIORITY

This patent application claims priority from German Patent Application No. 102017116936.9 filed Jul. 26, 2017, which is herein incorporated by reference in its entirety.

TECHNICAL FIELD

The present invention relates to a device and a method for producing an electrically conductive connection between an electrical conducting element and a printed circuit board of a light fixture, as well as a corresponding light fixture.

BACKGROUND

In the case of lamps, in particular LED lamps, the available mains voltage must regularly be converted by an electronic driver into a voltage suitable for the LEDs. For this purpose, the driver is usually connected by means of conducting elements (for example wires) to contact elements (for example pins) arranged in the base of the lamp. Generally, in this case, the wires are simply pressed into the base pins.

However, the contact to the printed circuit board or to the driver is produced by plugs or by soldering. This can have the disadvantage that plugs cannot be positioned by an automatic placement machine, so consequently, a plug connection often additionally requires manual assembly. Furthermore, plugs are relatively expensive, so they do not constitute an optimal solution in economic terms.

Thus, a connection usually takes place by soldering wires on the printed circuit board. However, soldering is very time-consuming and there is not only the danger of a cold solder point (where the wires are mechanically connected to the printed circuit board but no electrically conductive connection exists), but also the danger that the wires are not firmly connected to the printed circuit board, so that a connection can be easily released.

SUMMARY OF THE INVENTION

Starting from the known prior art, it is an object of the present invention to provide an improved device for producing an electrical connection of an electrical conducting element to a printed circuit board, in particular the printed circuit board of a light fixture, as well as a corresponding method and a light fixture.

The object is achieved by a tube, a method and a light fixture with the features of the independent claims. Advantageous further embodiments are set out in the dependent claims.

Accordingly, a tube is proposed for an electrical connection of an electrical conducting element to a printed circuit board of a light fixture, wherein the tube has a through opening (an opening that passes through the tube) to receive an electrical conducting element (for example wire). In this case, the tube has a first and a second region. The wall of the first region extends parallel to a longitudinal direction of the tube and is at least partially deformable inwards. The second region has a first section adjoining the first region and a second section adjoining the first section, wherein the diameter of the first section along the longitudinal direction is enlarged from the first region to the second section.

The tube is manufactured substantially from an electrically conductive material, for example metal. The tube preferably consists of one single material or metal, but alternatively it can also be made up in sections from a plurality of electrically conductive materials. However, the tube is preferably formed integrally or in one piece. Furthermore, the tube can have a substantially cylindrical shape, wherein it comprises an outer surface and an inner surface which define a wall. In this case the through opening is arranged in a radially inner region and defines an inner surface of the tube. The first and the second region preferably extend substantially coaxially and in the longitudinal direction of the tube, so that an electrical conducting element, for example a wire or a pin, can be easily introduced into the tube or into the openings thereof due to a corresponding dimensioning of the opening.

The increase in the diameter of the first section along the longitudinal direction from the first region to the second region has, inter alia, the advantage that the introduction of an electrical conducting elements is facilitated. As a result of an optimized interaction of the geometric arrangement, when soldering the tube to the printed circuit board no soldering agent can penetrate into the opening of the tube, or this opening is at least not closed because of the surface tension and the flowability of the soldering agent, so that a subsequent introduction of an electrical conducting element is enabled.

A continuous and uniform enlargement of the diameter of the first section is preferably provided, wherein the first section can extend, for example in a straight line, slanted, rounded, and/or conical manner. However, the diameter of the first section can also be increased in a stepped or undulating manner.

The wall of the second section can extend parallel to the longitudinal direction or cylindrically but also conically or frustoconically relative to the longitudinal direction. A parallel or cylindrical configuration of the second section with respect to the longitudinal direction has, inter alia, the advantage that the second section forms a projecting collar, which can be easily achieved in the inserted state of the tube in a printed circuit board for soldering and thus provides an improved interface. A conical configuration has, inter alia, the advantage that an electrical conducting element can be more easily introduced into the opening of the tube.

Thus, with a corresponding shape of the first and/or second section, the second region preferably forms at least one chamfer or step and/or is funnel-shaped. In this case, the chamfer can be substantially straight or also rounded. Such a configuration of the second region has the advantage that the insertion of the tube or the second region into the printed circuit board is facilitated.

Thus, the first section of the tube inserted into the printed circuit board can bear against a bore or cutout in the printed circuit board and can, for example, form an interface. Thus, the chamfer(s) or funnel shape of the second region can prevent turning, prevent slipping or prevent falling out of the tube and consequently can enable a primary fastening of the tube to the printed circuit board. In other words, the tube is retained by the configuration of the second region to the printed circuit board and at least the tube slipping through is prevented. Furthermore, during insertion of the tube into the printed circuit board, the first section can be at least partially deformed, so that a force-fitting connection or a press fit between the tube and the printed circuit board is provided. This facilitates a subsequent working step, for example a soldering operation.

The shape of the first section can also be substantially adapted to the shape of the bore or cutout in the printed circuit board, so that the first section of the second region is at least partially received by the bore or cutout, and an improved hold is provided. Furthermore, the first section can have a substantially round shape which flattens towards the second section and the first region. Consequently, the first section can have a curved shape or elbow shape, wherein the flattened points in the inserted state in a printed circuit board lie on a surface and/or bore of the printed circuit board. In this case the second section can form a projecting collar which extends either conically or cylindrically. This has the advantage that a lateral slipping or tilting of the tube is prevented and the tube is stabilized in the inserted state.

An angle in the range between 20° and 60°, preferably between 25° and 35°, preferably lies between a wall of the first section and the longitudinal direction of the tube. Tests carried out have demonstrated that the ingress of soldering agent into the opening of the tube can be reduced by the adaptation of the angle in these regions, wherein the angle, in particular in the range between 25° and 35°, reduces or prevents ingress of soldering agent whilst providing improved hold of the tube or a primary fastening of the tube to the printed circuit board.

An angle in the range between 0° and 20°, preferably between 1° and 10°, particularly preferably between 2° and 3°, lies between a wall of the second section and the longitudinal direction of the tube. As a result, an improved or simplified introduction of an electrical conducting element into the tube is made possible.

Furthermore, a neck or collar which projects at least partially from the printed circuit board is formed due to the angle of the second section which is smaller by comparison with the first section. This neck or collar has, inter alia, the advantage that during soldering no soldering agent enters the tube and simultaneously the lateral extent of the second region remains small, so that little space is occupied, and soldering can take place or the soldering interface between the tube and the printed circuit board is easily available.

For improved stability of the tube in the inserted state in the printed circuit board and an improved hold of an electrical conducting element received in the opening, in the longitudinal direction of the tube the first region preferably has a size ratio of at least 2:1 relative to the second region. A size ratio of 5:1 to 10:1 is preferably provided. Due to the relatively larger, deformable first region, a likewise larger contact area is provided between the tube and an introduced electrical conducting element so that a correspondingly larger engagement area is provided. Furthermore, a greater length of the first region can provide increased stability for an electrical conducting element received therein.

The specified tube is particularly advantageous for equipping a printed circuit board of a lamp or LED lamp. Thus, tubes are generally cost-effective to manufacture. Furthermore, due to the configuration of the first section of the second region the tube can be securely held at least partially by the printed circuit board and accordingly can be soldered thereto. However, the electrically conductive connection to the electrical conducting element is produced by means of the deformation of the first region, so that the soldering is not hampered. For example, the deformation can take place by pressing together or crimping of the first region by a corresponding tool, so that due to a deformation both a reliable, mechanical and also an electrical connection between the tube or the first region and the electrical conducting element is produced. Thus, the deformability of the first region enables a reliable and fast compression of the first region and an electrical conducting element or wire received therein, which is advantageous in particular for the production of a driver of a lamp or for equipping a printed circuit board of a lamp.

Consequently, the tubes can be fitted or applied to a printed circuit board, for example by an automatic placement machine for driver components, simply and in the same step as the components or driver components, and can be soldered by an automatic soldering machine, so that automatic fabrication and a cost saving is possible, and the time required is reduced.

Furthermore, a light fixture, preferably a LED light fixture, is proposed which comprises a housing with contact elements, at least one light source, at least one printed circuit board, at least one electrical conducting element and at least one tube according to the invention. The printed circuit board has a first surface, a second surface and at least one continuous bore between the first surface and the second surface, wherein each tube is introduced into a corresponding bore and is electrically conductively connected to the printed circuit board. In this case an electrical conducting element is received in the opening of each tube so that the tube is electrically conductively connected to the electrical conducting element.

Furthermore, to supply power, the electrical conducting element can be connected to a contact element. For example, a contact pin arranged in the base or a contact screw connection can also produce a connection to another printed circuit board.

Fundamentally, only one bore and a tube, inserted therein, can be provided when an electrical conducting element is received by the tube, and each further electrical conducting element can be connected in a different way to the printed circuit board. For example, this electrical conducting element can be simply soldered to the printed circuit board, when the location provided therefor is separated from other components and/or is decentralized. Likewise, for supplying power, a contact element can be connected to the printed circuit board by means of a tube while a second contact element is connected to the printed circuit board by means of, for example, a contact spring or screw connection. Preferably, however, at least two tubes and bores are provided, so that at least the electrical conducting elements, which are electrically conductively connected to the contact elements, are connected to the printed circuit board by means of tubes.

For an improved fastening and connection, the bore is preferably adapted to the first section of the second region of the tube and partially receives this section. Thus, the tube in the inserted state is retained by the printed circuit board. The bore is preferably configured in such a way that a force-fitting connection is provided between the tube and the printed circuit board in the inserted state of the tube and by deformation of the first section of the tube. For example, the bore can have a substantially cylindrical shape, wherein the diameter of the bore is adapted to the tube in such a way that the bore at least partially surrounds the first section of the tube. Accordingly, the bore can be configured in such a way that the tube can be very precisely mounted or positioned, and a primary connection is already provided before a soldering operation, so that slipping or falling out is made difficult or prevented. Alternatively, other shapes can be provided for the bore; for example, the bore can be configured in such a way that it is at least partially flush with the first section or is conical.

Furthermore, it may be provided that a soldering surface is arranged around the bore and the tube is soldered to the printed circuit board. The soldering surface is preferably arranged between the second section of the tube and the printed circuit board, i.e. on the side of the printed circuit board from which the tube is inserted. The soldering surface makes it possible for the printed circuit board to be electrically connected to the tube by means of at least one solder point (tin solder). In this case the soldering surface or solder pad or solder plate can be configured in such a way that the soldering is facilitated and an undesirable escape of soldering agent onto other regions of the printed circuit board is made difficult or prevented. Consequently, the soldering operation can be made easier by the design of the soldering surface or the solder pad on the printed circuit board.

Due to the connection of the soldering surface, the adjoining copper surface and conductive tracks to the tube, the heat from the first surface is dissipated onto the second surface of the printed circuit board and the temperature can be distributed over the printed circuit board. Consequently, the upper face and the lower face of the printed circuit board are thermally connected to one another and the heat of the LED is dissipated better and accordingly exchanged. Such heat dissipation can be further improved by means of at least one solder point between the tube and a soldering surface or copper surface arranged on the second surface of the printed circuit board.

The soldering surface is preferably substantially circular and has at least one protrusion on its circumference. This shape has, inter alia, the advantage that in a soldering operation the soldering surface on the protrusion can be contacted with the soldering iron, so that the soldering surface can be heated without the danger that the tube is moved with the soldering iron. Instead of a larger soldering surface, a protrusion from a smaller soldering surface is provided, so during soldering the heat is conducted better into the middle of the soldering surface and thus to the tube.

Although the interaction between the bore and the tube can already complicate or prevent slipping or falling out of a received tube, in the case of a soldering surface arranged on the printed circuit board the tube can furthermore be engaged with the soldering surface. This preferably takes place by means of a force fit, wherein the soldering surface preferably surrounds the first section of the tube. Furthermore, a form fit can be provided, wherein the first section of the tube has, for example a projection or protrusion, which the introduced state is held by a projecting part of the soldering surface and is in engagement therewith.

Consequently, different alternative possibilities are provided, which can provide a releasable or fixed connection of the tube to the printed circuit board.

Furthermore, the printed circuit board can be connected for example to at least one cooling element and/or at least one further printed circuit board or a driver.

Furthermore, the light fixture can have, inter alia, a lens or light-permeable cover.

The stated light fixture with the PCB (printed circuit board) and at least one tube according to the invention is advantageous, in particular for LED-based lamps (for example retrofit lamps). Thus, due to the cooperation of the bore, or cutout of the printed circuit board, with a corresponding tube, an automatic fabrication of a driver or a printed circuit board, with the aforementioned advantages, is economically viable. Therefore, the light fixture can be produced particularly cost-effectively, more reliably, quicker and automatically.

Furthermore, a method for producing an electrically conductive connection between a printed circuit board and at least one electrical conducting element is provided. The method comprises at least the production of at least one continuous bore in the printed circuit board and the insertion of at least one tube into a corresponding bore in the printed circuit board, as well as, the production of an electrically conductive connection between the printed circuit board and the tube. Furthermore, the electrical conducting element is introduced into the tube and an electrically conductive connection is produced between the tube and the electrical conducting element.

The tube preferably corresponds to a tube according to the invention, so that in the method step of producing at least one continuous bore in the printed circuit board the shape of the second section of the tube can, likewise, be taken into consideration.

During insertion of the tube into a corresponding bore in the printed circuit board, a force-fitting connection is preferably provided between the tube and the printed circuit board by means of deformation of the tube. When a tube according to the invention is used, this preferably takes place by deformation of the second region, for example when the tube is pressed into the bore. Thus, it is ensured that the tube is securely held by the printed circuit board and the tube also does not slip during further working steps.

The electrically conductive connection between the tube and the electrical conducting element is preferably produced by deformation of the tube. This can take place for example by crimping and, in the case where a tube according to the invention is used, for example by crimping of the first region.

As already described comprehensively, the equipping of a printed circuit board with a tube and the deformation of a region of the tube, inter alia, has the advantage that the tube can be inserted into the printed circuit board by an automatic placement machine and can be soldered to the driver components in the same working step by an automatic soldering machine. Likewise, the introduction of an electrical conducting element or wire through a corresponding configuration of the tube is not hampered by the soldering operation, so that the electrical conducting element can likewise be simply introduced into the tube automatically by a machine, cut to the correct length and deformed or compressed by a corresponding tool, for example pliers. Thus, no costly and manual soldering of the wire in the printed circuit board is necessary.

The insertion of the tube into the corresponding bore in the printed circuit board preferably takes place in a common working step when the printed circuit board is equipped with at least one component, and this is carried out by an automatic placement machine.

The electrically conductive connection between the printed circuit board and the tube is preferably produced by soldering the tube to the printed circuit board. The soldering of the tube to the printed circuit board can take place by means of a soldering surface.

Furthermore, the soldering of the tube to at least one surface of the printed circuit board preferably takes place in a working step with the soldering of at least one component on the printed circuit board, and this is carried out by an automatic soldering machine.

Likewise, the introduction of the electrical conducting element into the tube and the deformation of the tube preferably takes place in one working step, and this is carried out by an automatic machine, wherein the electrical conducting element is preferably cut to size after the deformation.

BRIEF DESCRIPTION OF THE DRAWINGS

Preferred further embodiments of the invention are explained in greater detail by the following description of the drawings. In the drawings.

DETAILED DESCRIPTION OF PREFERRED EXEMPLARY EMBODIMENTS

Figure 1:
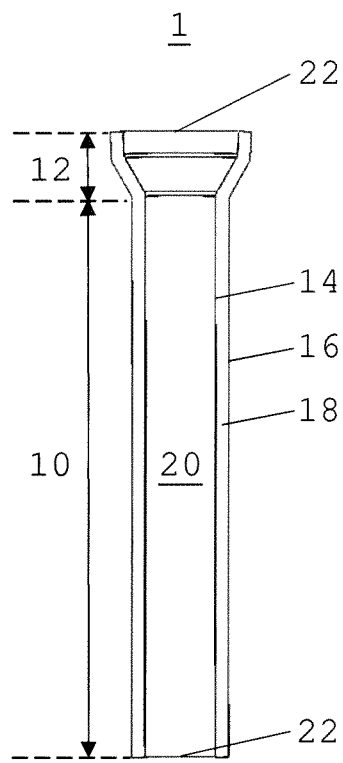
FIG. 1 shows a schematic longitudinal section through a tube with a continuous first region.

Preferred exemplary embodiments are described below with reference to the drawings. In this case elements which are the same, similar, or act in the same way are provided with identical reference numerals in the different drawings, and repeated description of some of these elements is omitted in order to avoid redundancies.

FIG. 1 shows schematically a longitudinal section through a tube 1 which has a first region 10 and a second region 12. In this case the tube 1 has an outer surface 16 as well as an inner surface 14, which together define a wall 18. The inner surface 14 is defined by a continuously extending opening 20 arranged in the longitudinal direction and in the radially inner region of the tube 1. The continuous opening 20 has two ends, shown here as opposing, and thus forms two open ends 22. The second region 12 is arranged on one of the open ends 22. The first region 10 is likewise shown here as continuous and adjoining the second region 12. The widened portion of the second region 12 in relation to the first region 10 makes it possible that the tube 1 can be introduced into a bore in a printed circuit board, wherein at least a part of the second region 12 can be received by the bore or rests on the printed circuit board. Thus, the second region 12 of the tube 1 ensures, inter alia, a secure hold of the tube 1 in a printed circuit board.

Figure 2A:
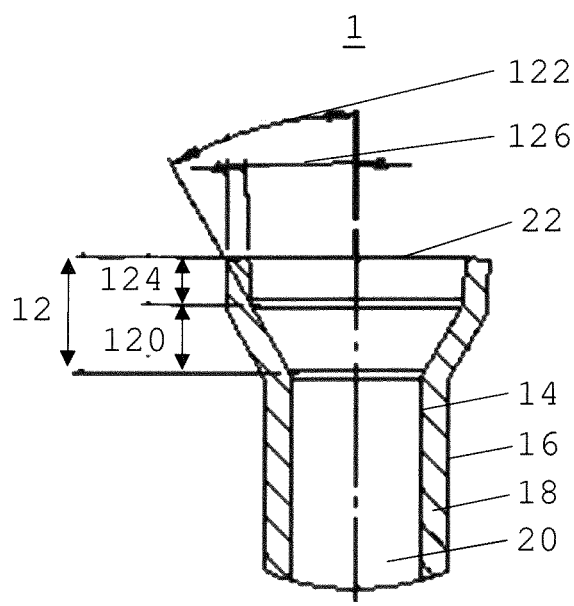
FIG. 2A shows a schematic longitudinal section through the second region of a tube with illustrated sections and configurations of the second region.
Figure 2B:
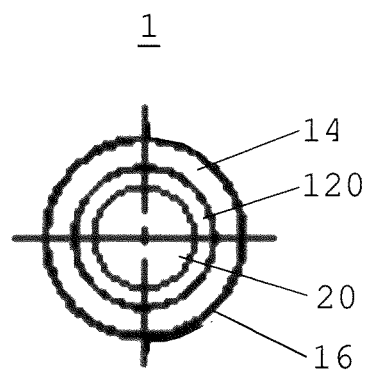
FIG. 2B shows a plan view of an open end of a tube on the second region.

One possible embodiment of the second region 12 is shown schematically in FIG. 2A. The second region 12 has a first section 120 and a second section 124, wherein the first section 120 adjoins the first region 10 and the second section 124 adjoins the first section 120. The diameter of the first section 120 increases along the longitudinal direction from the first region 10 to the second section 124. The second section 124 is shown here as conical, wherein the widened portion or the angle 126 of the second section 124 in relation to the longitudinal axis of the tube 1 is less than the corresponding angle 122 of the first section 120. FIG. 2B shows a corresponding plan view of the two sections.

Figure 3:
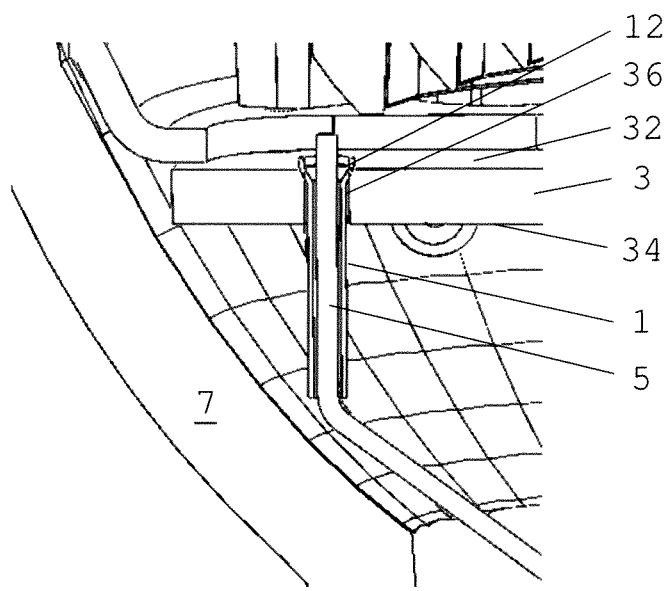
FIG. 3 shows a schematic longitudinal section through a light fixture with a printed circuit board, a tube and an introduced wire.

A tube 1 connected to a printed circuit board 3 is illustrated schematically in FIG. 3 in a longitudinal section through a light fixture. The longitudinal section shows different possible elements of a light fixture which are arranged in a housing 7. The printed circuit board 3 has a first surface 32 and a second surface 34 and the printed circuit board 3 has a continuous bore 36 or cutout arranged between them. A tube 1 is received in the bore 36, wherein the second region 12 of the tube 1 is received at least partially by the bore 36 and rests on the printed circuit board 3. Furthermore, the tube 1 is connected by means of at least one solder point (not shown) to the printed circuit board 3. An electrical conducting element 5 or wire is received in the tube 1. The electrical conducting element 5 can be electrically connected to the tube 1 by a deformation of the first region (not shown) of the tube 1 and are held thereby.

Figure 4:
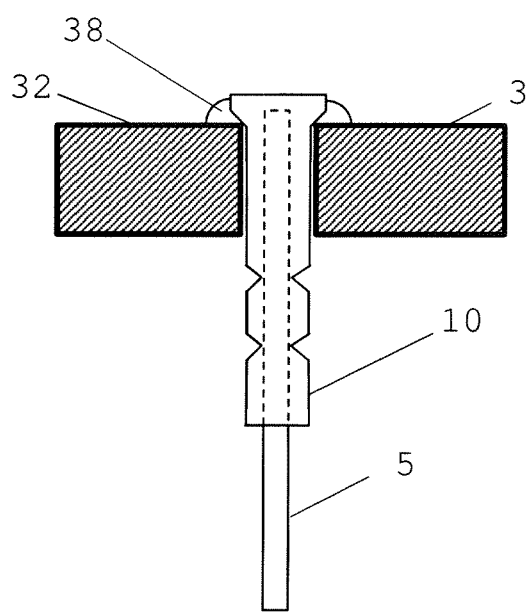
FIG. 4 shows a schematic longitudinal section through a printed circuit board with a tube, a solder point and an introduced wire.

A solder point 38 provided for connection of the tube 1 to the printed circuit board 3 is illustrated schematically in FIG. 4. Accordingly, the solder point 38 connects the tube 1 or the second region thereof to the printed circuit board 3 by means of a copper surface or electrically conductive surface on the first surface 32 of the printed circuit board 3. A wire 5 which is firmly connected to the tube 1 by a deformation of the first region 10 is likewise received in the tube 1.

Figure 5:
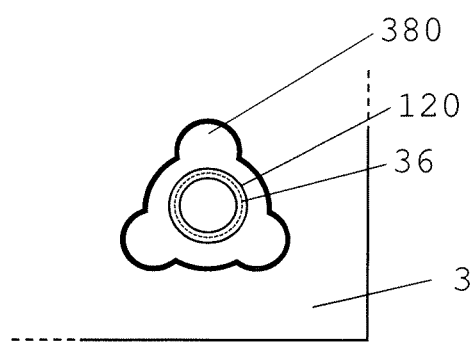
FIG. 5 shows a schematic plan view of a printed circuit board with a tube and a soldering surface.

Alternatively, as shown schematically in FIG. 5, a solder point can likewise be alternatively applied by means of a soldering surface 380 arranged on a first surface 32 of the printed circuit board 3. The soldering surface 380 is substantially circular and has three protrusions on its circumference. The protrusions are illustrated as substantially semicircular in the present case and have, inter alia, the advantage that in a soldering operation the soldering surface 380 on the protrusion can be contacted with the soldering iron, so that the soldering surface 380 can be heated, without the danger that the tube 1 is moved with the soldering iron. Although the protrusions are illustrated in the present case as substantially semicircular, however, a different shape can be provided, for example a rectangular, triangular, pyramidal or trapezoidal shape.

The soldering surface 380 can be in engagement with the tube 1 or with the second region (not shown) or with the first section 120, so that during introduction into a bore 36, or during equipping of the printed circuit board 3, the tube 1 is already mechanically and/or electrically conductively connected to the printed circuit board 3 and securely held by the printed circuit board 3. For example, the tube 1 can be held by means of a press fit or positive engagement with the soldering surface 380 and/or a bore 36. Consequently, a subsequent soldering step can take place without manual intervention and also regardless of the orientation of the printed circuit board 3.

Although the invention has been illustrated and described in greater detail by the depicted exemplary embodiments, the invention is not restricted thereto and other variations can be deduced therefrom by the person skilled in the art without departing from the scope of protection of the invention.

In general, "a" or "an" may be understood as a single number or a plurality, in particular in the context of "at least one" or "one or more" etc., provided that this is not explicitly precluded, for example by the expression "precisely one" etc.

Also, when a number is given this may encompass precisely the stated number and also a conventional tolerance range, provided that this is not explicitly ruled out.

If applicable, all individual features which are set out in the exemplary embodiments can be combined with one another and/or exchanged for one another, without departing from the scope of the invention.

LIST OF REFERENCES 1 tube
10 first region
12 second region
120 first section
122 angle of the first section
14 inner surface
124 second section
126 angle of the second section
16 outer surface
18 wall
20 opening
22 open end
3 printed circuit board
32 first surface
34 second surface
36 bore
38 solder point
380 soldering surface
5 electric conducting element or wire
7 housing

The invention claimed is:

1. A device for electrical connection of an electrical conducting element to a printed circuit board, the device comprising a tube having:
    a through opening sized to receive the electrical conducting element;
    a first region, wherein a wall of the first region extends parallel to a longitudinal direction of the tube and is at least partially deformable inwards by crimping such that an electrically conductive connection to the electrical conducting element is produced by constriction resulting from the deformation; and
    a second region having a first section adjoining the first region and a second section adjoining the first section, wherein a diameter of the first section along the longitudinal direction is enlarged from the first region to the second section.

2. The device according to claim 1, wherein the wall of the second section extends parallel to the longitudinal direction or cylindrically.

3. The device according to claim 1, wherein the wall of the second section extends conically.

4. The device according to claim 3, wherein an angle in the range between 0° and 20° lies between a wall of the second section and the longitudinal direction of the tube.

5. The device according to claim 3, wherein an angle in the range between 2° and 3°, lies between a wall of the second section and the longitudinal direction of the tube.

6. The device according to claim 1, wherein the second region forms at least one of a chamfer, a step, and a funnel-shaped portion.

7. The device according to claim 1, wherein an angle in the range between 20° and 60° lies between a wall of the first section and the longitudinal direction of the tube.

8. A light fixture comprising:
    a housing with contact elements;
    at least one light source;
    at least one printed circuit board with at least one continuous bore;
    at least one electrical conducting element; and
    at least one tube according to claim 1;
    wherein each tube is introduced into a corresponding bore of the at least one continuous bores and is electrically conductively connected to the at least one printed circuit board; and
    wherein each of the at least one electrical conducting element is received in the opening of each of the at least one tube, wherein the at least one tube is electrically connected to the at least one electrical conducting element.

9. The device according to claim 1, wherein the first region has a size ratio of at least 2:1 relative to the second region.

10. The device according to claim 1, wherein the first region has a size ratio in the range of 5:1 to 10:1 relative to the second region.

11. The device according to claim 1, wherein the first region is of substantially uniform diameter along the longitudinal direction.

12. The device according to claim 1, wherein other than at the second region, the tube is of substantially uniform diameter along the longitudinal direction.

13. The device according to claim 1, wherein the wall of the first region is uninterrupted by any projection.

14. The device according to claim 1, wherein the wall of the first region is at least partially deformable inwards, in a non-resilient manner, by crimping such that the electrically conductive connection to the electrical conducting element is produced by constriction resulting from the non-resilient deformation.

15. A light fixture comprising:
    a housing with contact elements;
    at least one light source;
    at least one printed circuit board with at least one continuous bore;
    at least one electrical conducting element; and at least one device for electrical connection of the electrical conducting element to the printed circuit board, the device comprising a tube having:
        a through opening sized to receive the electrical conducting element; a first region, wherein a wall of the first region extends parallel to a longitudinal direction of the tube and is at least partially deformable inwards such that an electrically conductive connection to the electrical conducting element is produced by constriction resulting from the deformation; and
        a second region having a first section adjoining the first region and a second section adjoining the first section, wherein a diameter of the first section along the longitudinal direction is enlarged from the first region to the second section;
    wherein each tube is introduced into a corresponding bore of the at least one continuous bores and is electrically conductively connected to the at least one printed circuit board;
    wherein each of the at least one electrical conducting element is received in the opening of each of the at least one tube, wherein the at least one tube is electrically connected to the at least one electrical conducting element;
    wherein a soldering surface is arranged around the bore, and wherein the tube is soldered to the printed circuit board; and
    wherein the soldering surface is substantially circular and has at least one protrusion on the circumference.

16. A method for producing an electrically conductive connection between a printed circuit board and at least one electrical conducting element, the method comprising:
    producing at least one continuous bore in the printed circuit board;
    inserting at least one tube into the at least one continuous bore in the printed circuit board;

electrically connecting the printed circuit board and the tube;

introducing the electrical conducting element into the tube; and electrically connecting the tube and the electrical conducting element by at least partially deforming a first region of the tube inwards by crimping such that an electrically conductive connection to the electrical conducting element is produced by constriction resulting from the deformation.

17. The method according to claim 16, wherein during insertion of the at least one tube into the at least one continuous bore in the printed circuit board, a force-fitting connection is provided between the at least one tube and the printed circuit board, and wherein the force-fitting connection deforms the at least one tube.

18. The method according to claim 16, wherein the insertion of the at least one tube into the at least one continuous bore in the printed circuit board takes place in a common working step with the equipping of the printed circuit board with at least one component and is carried out by an automatic placement machine.

19. The method according to claim 16, wherein the electrically conductive connection is produced between the printed circuit board and the at least one tube by soldering the at least one tube to at least one surface of the printed circuit board.

20. The method according to claim 19, wherein the soldering of the at least one tube to at least one surface of the printed circuit board takes place in one working step with the soldering of at least one component on the printed circuit board and is carried out by an automatic soldering machine.

* * * * *